(12) United States Patent
Her et al.

(10) Patent No.: US 7,321,998 B2
(45) Date of Patent: Jan. 22, 2008

(54) SEMICONDUCTOR INTEGRATED CIRCUIT HAVING A NUMBER OF DATA OUTPUT PINS CAPABLE OF SELECTIVELY PROVIDING OUTPUT SIGNALS AND TEST METHOD THEREOF

(75) Inventors: Nam-Jung Her, Kyungki-do (KR); Seok-Young Han, Kyungki-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 405 days.

(21) Appl. No.: 10/803,792

(22) Filed: Mar. 17, 2004

(65) Prior Publication Data
US 2005/0005210 A1 Jan. 6, 2005

(30) Foreign Application Priority Data
Mar. 17, 2003 (KR) .................... 10-2003-0016587

(51) Int. Cl.
*G01R 31/28* (2006.01)
(52) U.S. Cl. .................... 714/724; 714/27; 714/30; 714/734
(58) Field of Classification Search ............... None
See application file for complete search history.

(56) References Cited
U.S. PATENT DOCUMENTS

| | | | | |
|---|---|---|---|---|
| 4,348,759 A * | 9/1982 | Schnurmann | ............... | 714/724 |
| 4,357,703 A * | 11/1982 | Van Brunt | ............... | 714/733 |
| 4,724,379 A * | 2/1988 | Hoffman | ............... | 307/115 |
| 5,025,205 A * | 6/1991 | Mydill et al. | ............... | 324/73.1 |
| 5,315,241 A * | 5/1994 | Ewers | ............... | 438/15 |
| 5,457,380 A * | 10/1995 | Blumenau | ............... | 324/158.1 |
| 5,506,510 A * | 4/1996 | Blumenau | ............... | 324/754 |
| 5,712,858 A * | 1/1998 | Godiwala et al. | ............... | 714/724 |
| 5,909,450 A * | 6/1999 | Wright | ............... | 714/724 |
| 6,971,045 B1 * | 11/2005 | Deb et al. | ............... | 714/30 |
| 2001/0044918 A1 * | 11/2001 | Sato et al. | ............... | 714/718 |
| 2005/0166113 A1 * | 7/2005 | Ozawa | ............... | 714/736 |

* cited by examiner

*Primary Examiner*—Cynthia Britt
*Assistant Examiner*—Steven D. Radosevich
(74) *Attorney, Agent, or Firm*—Marger, Johnson & McCollom, P.C.

(57) ABSTRACT

A semiconductor integrated circuit includes a plurality of data output pins, a data processing circuit to generate output signals responsive to an input signal, and an output selection circuit with at least a normal mode and a test mode. A first group of output signals are provided to a first group of data output pins in a first test cycle of the test mode. And a second group of output signals are provided to a second group of data output pins during a second test cycle of the test mode. The semiconductor integrated circuit can be tested by means of a test device having less test pins than the output pins of the semiconductor integrated circuit under test.

13 Claims, 9 Drawing Sheets

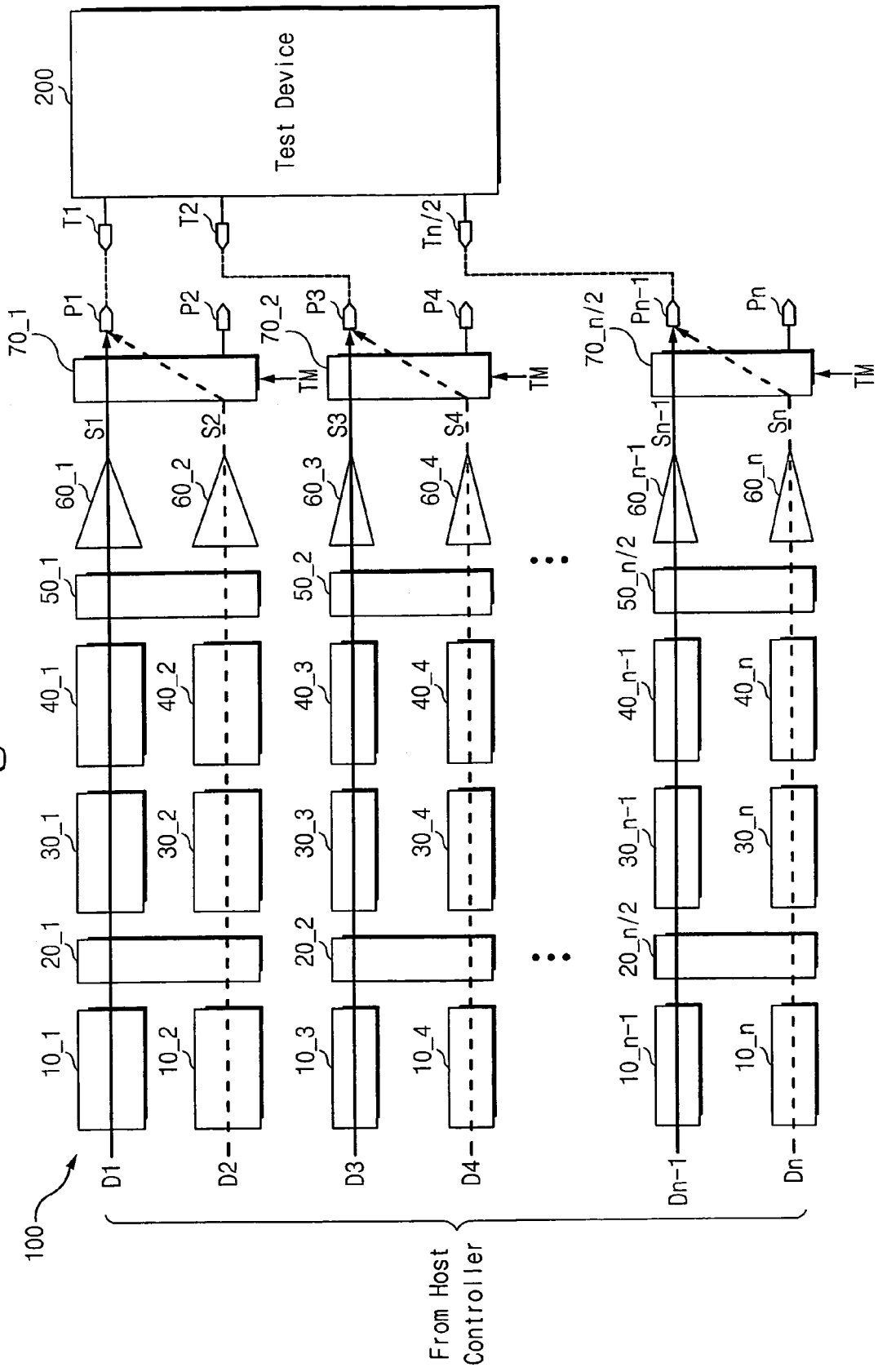

SEMICONDUCTOR INTEGRATED CIRCUIT HAVING A NUMBER OF DATA OUTPUT PINS CAPABLE OF SELECTIVELY PROVIDING OUTPUT SIGNALS AND TEST METHOD THEREOF

RELATED APPLICATION INFORMATION

This application claims priority from Korean application number 2003-16587, filed Mar. 17, 2003, in the Korean Intellectual Property Office, the disclosure of which is incorporated by reference in its entirety.

FIELD OF THE INVENTION

The present invention relates to a semiconductor integrated circuit and, more particularly, to a semiconductor integrated circuit having a number of data output pins capable of selectively providing output signals and a test method thereof.

BACKGROUND OF THE INVENTION

FIG. 1 is a diagram of a typical thin film transistor liquid crystal display (TFT-LCD) module 1. The TFT-LCD module 1 includes a liquid crystal display (LCD) panel 5, a drive circuit 2, and a backlight 7. The drive circuit 2 has a plurality of gate driver integrated circuits (ICs) 6A-6B and source driver ICs 6C-6E for driving a LCD panel 5. A plurality of printed circuit boards (PCBs) receive a variety of circuit components such as a timing controller (not shown). The LCD panel 5 is liquid crystal inserted between two glass substrates. The LCD panel 5 enables the transmission of white light, from the backlight 7, to a given pixel in order to express color images. Each pixel has a pixel signal voltage generated by the driving circuit 2 that determines where the LCD transmits the light. The backlight 7 has a lamp 8 and a reflex plate 9. The backlight 7 generates white light with the lamp 8 acting as the light source.

As is well known in the art, the LCD panel 5 includes gate lines and source lines which are intersected in a lattice shape. A pixel is the intersection of a gate line and a data line. For example, an LCD panel for a VGA (video graphics array) mode includes 640×480 pixels and an LCD panel for an XGA (extended graphics array) mode includes 1024×768 pixels. To drive a number of pixels, a gate driver IC, e.g., 6A, and a source driver IC, e.g., 6C, have a number of output pins. The number of these output pins is related to the resolution of the LCD panel 5 that the IC services. Since an IC cannot have innumerable output pins, the LCD module 1 uses a plurality of serially connected ICs. For example, since the LCD panel for the VGA mode has 640 source lines, a source driver IC 6C having 320 output pins must be serially connected to a second source driver IC 6B with 320 out pins.

A semiconductor IC is, generally, tested by assigning test pins to all of the input and output pins, and then connecting the test pins to an appropriate test device. With the advent and development of high definition LCD panels, the number of output pins installed to the drive circuit 2 is increasing and therefore the distance between pins is decreasing. This leads to a difficulty in testing the drive circuit 2 because of the increasing number of test pins needed on an appropriate test device to properly test the drive circuit 2.

SUMMARY OF THE INVENTION

We describe a semiconductor integrated circuit capable of selectively providing output signals to test semiconductor integrated circuits by means of a test device having less pins than the semiconductor integrated circuits it tests.

And we describe a test method of a semiconductor integrated circuit by means of a test device having less pins than the semiconductor integrated circuits it tests.

A semiconductor integrated circuit includes a plurality of data output pins, a data processing circuit to generate output signals responsive to an input signal, and an output selection circuit with at least a normal mode and a test mode. A first group of output signals are provided to a first group of data output pins in a first test cycle of the test mode. And a second group of output signals are provided to a second group of data output pins during a second test cycle of the test mode.

In an embodiment, the test cycles of the output selection circuit are repeated during the test mode.

In an embodiment, the output selection circuit repeats the first and second test cycles during testing.

In an embodiment, the output selection circuit sends ith output signals (i being a positive integer) to ith data output pins during the first cycle of the test mode. And the output selection circuit sends (i+1)th output signals to ith output pins during the second test cycle of the test mode.

In an embodiment, the output selection circuit sends ith output signals (i being a positive integer) to (i+1)th data output pins during the first cycle of the test mode. And the output selection circuit sends the (i+1)th output signals to (i+1)th output pins during the second test cycle of the test mode.

A method for outputting data during a test mode of a semiconductor integrated circuit having a plurality of data output pins is provided. The method includes sending some output signals to a first group of the data output pins and sending remaining output signals to the first group of the data output pins.

In an embodiment, the sending some output signals and the sending remaining output signals are repeated during a test mode.

In an embodiment, the sending some output signals includes sending ith output signals (i being a positive integer) are sent to ith data output pins.

In an embodiment, i is a positive odd integer.

In an embodiment, the sending remaining output signals includes sending (i+1)th output signals (i being a positive integer) to ith data output pins.

BRIEF DESCRIPTION OF THE DRAWINGS

FIG. 4A and FIG. 4B show data output paths for the IC 100 shown in FIG. 2.

DESCRIPTION OF THE PREFERRED EMBODIMENT

Figure 1:
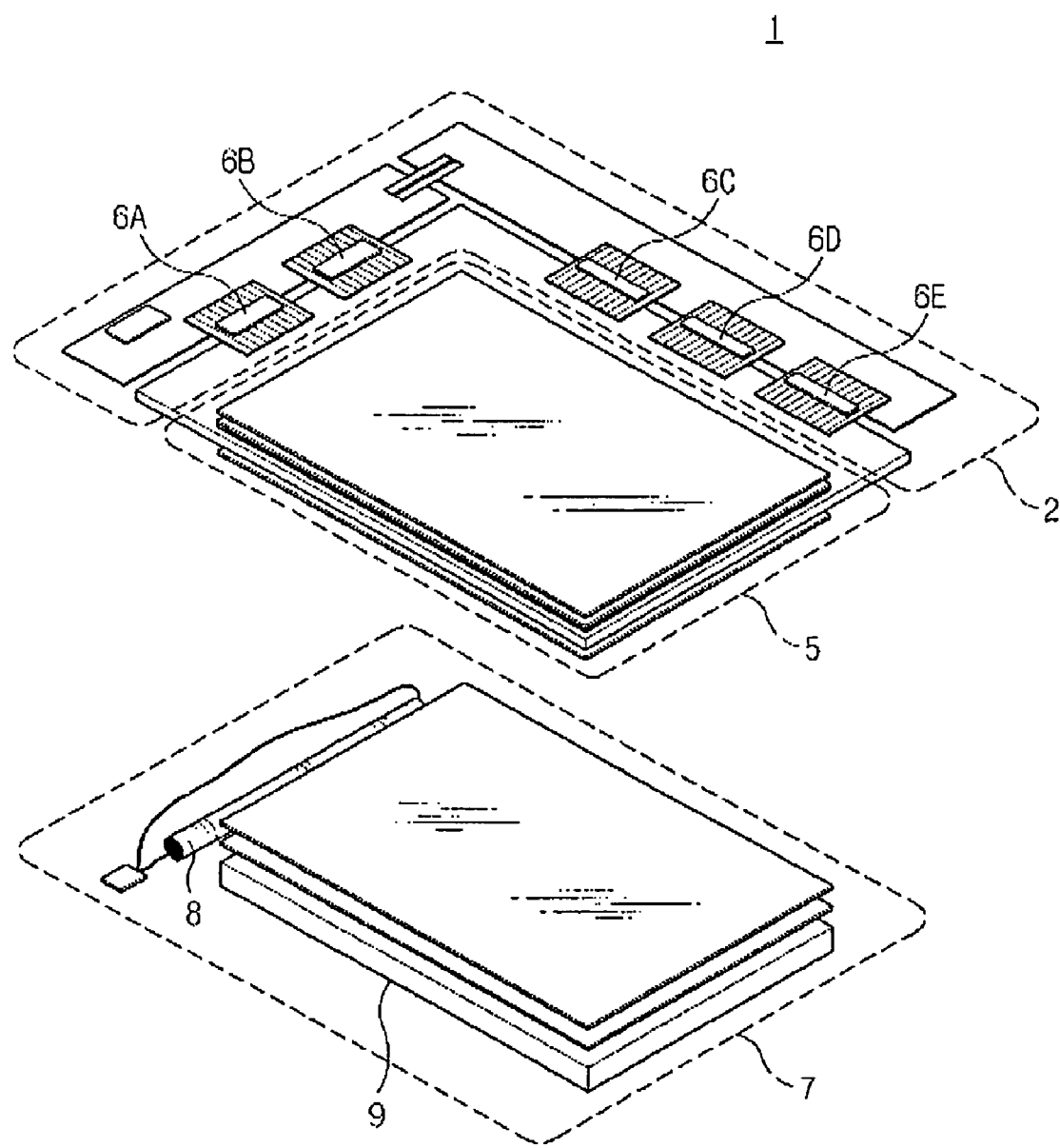
FIG. 1 is a block diagram of a typical TFT-LCD module.
Figure 2:
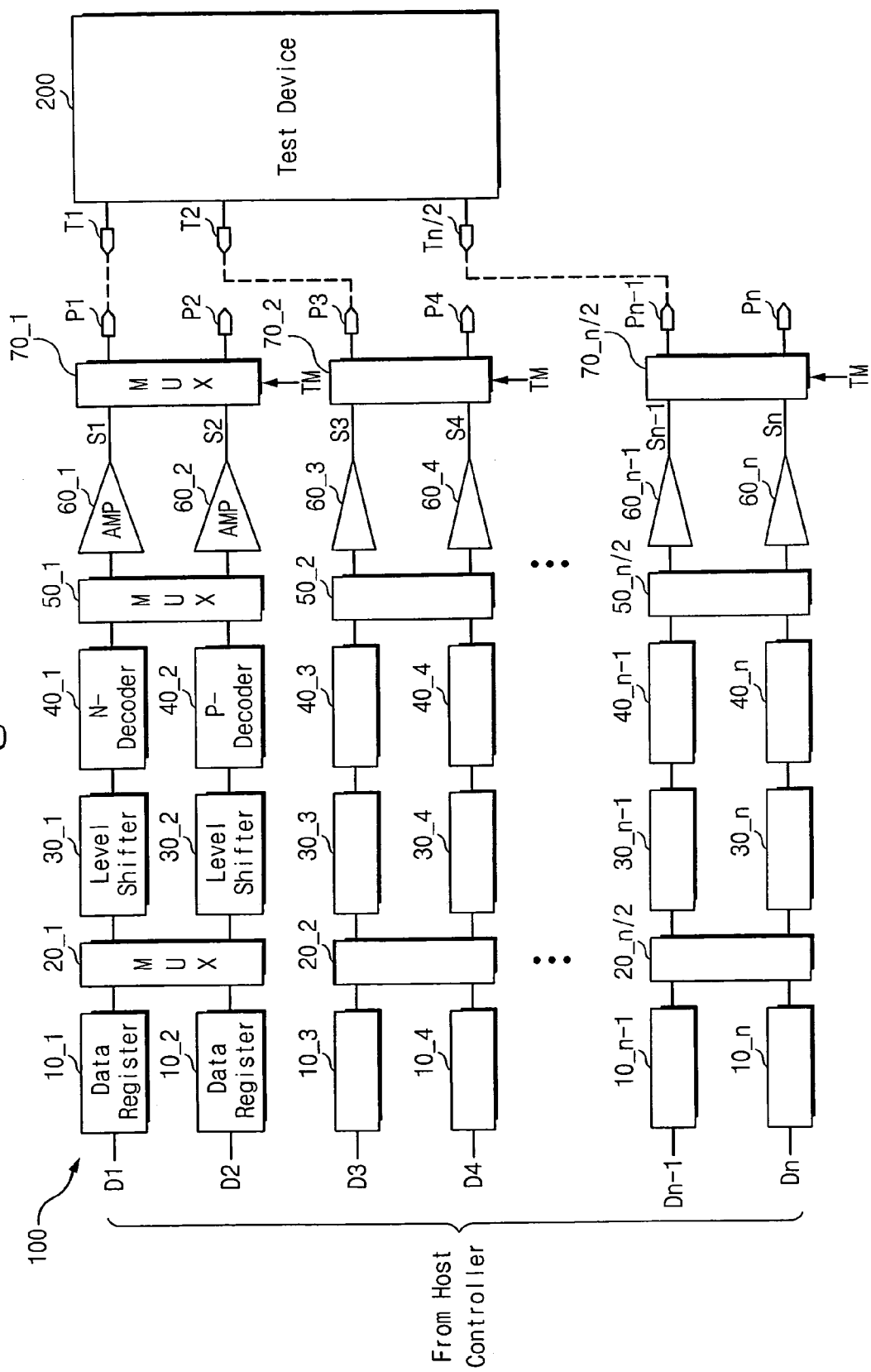
FIG. 2 is a block diagram of internal circuits of a source driver IC according to an embodiment of the present invention.

The construction of internal circuits of a source driver IC according to an embodiment of the present invention is illustrated in FIG. 2. Referring to FIG. 2, a source driver IC 100 includes data registers 10_1~10_n, multiplexers 20_1~20_n/2, 50_1~50_n/2, 70_1~70_n/2, level shifters 30_1~30_n, N-decoders 40_1, 40_3, . . . , and 40_n-1, P-decoders 40_2, 40_4, . . . , and 40_n, amplifiers 60_1~61_n, and data output pins P1~Pn.

The data registers 10_1~10_n receive and store RGB data signals D1~Dn from a host controller (not shown). The multiplexers 20_1~20_n/2 are each connected to the adjacent two data registers 10_1~10_n, where they receive data signals D1~Dn stored in the connected data registers 10_1~10_n and provide those data signals D1~Dn to the level shifters 30_1~30_n. For example, the multiplexer 20_1 transfers the data signals stored in the data registers 10_1 and 10_2 to the level shifters 30_1 and 30_2, respectively. In this case, the transfer direction is periodically varied. Namely, in a first period, the multiplexer 20_1 transfers the data stored in the data register 10_1 to the level shifter 30_1 and transfers the data stored in the data register 10_2 to the level shifter 30_2. In a second period, the multiplexer 20_1 transfers the data stored in the data register 10_1 to the level shifter 30_2 and transfers the data stored in the data register 10_2 to the level shifter 30_1. The other multiplexers 20_2~20_n/2 operates the same as the multiplexer 20_1. The level shifters 30_1~30_n increase the voltage level of data signals transferred from corresponding multiplexers 20_1~20_n/2 to a voltage level that is suitable for driving a pixel in device, e.g., an LCD.

The N-decoders 40_1, 40_3, . . . , and 40_n-1 and the P-decoders 40_2, 40_4, . . . , and 40_n decode a data signal having a voltage level increased by corresponding level shifters 30_1~30_n. That is, the N-decoders 40_1, 40_3, . . . , and 40_n-1 selectively outputs one of externally provided gray voltages according to the voltage level of the data signal transferred from the corresponding level shifters 30_1, 30_3, . . . , and 30_n-1. The P-decoders 40_2, 40_4, . . . , and 40_n selectively outputs one of externally provided gray voltages according to the voltage level of the data signal transferred from the corresponding level shifters 30_2, 30_4, . . . , and 30_n.

The data stored in the data registers 10_1 and 10_2 are cross provided to the level shifters 30_1 and 30_2 because the level of a data signal must be periodically inverted to prevent the degradation of a liquid crystal. For example, gray voltages provided to the N-decoders 40_1, 40_3, . . . , and 40_n-1 range from 0V to 7V, and gray voltages provided to the P-decoders 40_2, 40_4, . . . , and 40_n range from 8V to 15V. During the first cycle, externally provided data signals D1, D3, . . . , and Dn-1 are decoded to one of the gray voltage ranging from 0V to 7V by the N-decoders 40_1, 40_3, . . . , and 40_n-1, and the data signals D2, D4, . . . , and Dn are decoded to one of the gray voltage ranging from 8V to 15V by the P-decoders 40_2, 40_4, . . . , and 40_n. During the second cycle, externally provided data signals D1, D3, . . . , and Dn-1 are decoded to one of the gray voltage ranging from 8V to 15V by the P-decoders 40_2, 40_4, . . . , and 40_n, and the data signals D2, D4, . . . , and Dn are decoded to one of the gray voltage ranging from 0V to 7V by the N-decoders 40_1, 40_3, . . . , and 40_n-1.

The multiplexers 50_1~50_n/2 are each connected to one N-decoder and one P-decoder and transfer gray voltage, provided from the connected decoders, to the amplifiers 60_1~60_n. The multiplexers 50_1~50_n/2 align with the multiplexers 20_1~20_n/2. For example, if multiplexer 20_1 transfers the data signal D1 stored in the data register 10_1 to the level shifter 30_1 and provides the data signal D2 stored in the data register 10_2 to the level shifter 30_2, the multiplexer 50_1 transfers a signal outputted from the N-decoder 40_1 to the amplifier 60_1 and transfers a signal outputted from the P-decoder 40_2 to the amplifier 60_2. The operation of the other multiplexers 50_2~50_n/2 is identical with that of the multiplexer 50_1 and will not be explained in further detail.

Source driving signals S1~Sn from the amplifiers 60_1~60_n are provided to a pixel of a corresponding LCD panel (not shown) through data output pins P1~Pn and multiplexers 70_1~70_n/2. Multiplexers 70_1~70_n/2 are each coupled between two amplifiers 60_1~60_n and the data output pins P1~Pn. In a normal mode, the source driving signals S1~Sn are provided to the LCD panel through the data output pins P1-Pn. But during a test mode, the source driver circuit IC 100 selectively outputs the source driving signals S1~Sn to a limited number of data output pins P1~P_n.

Figure 3:
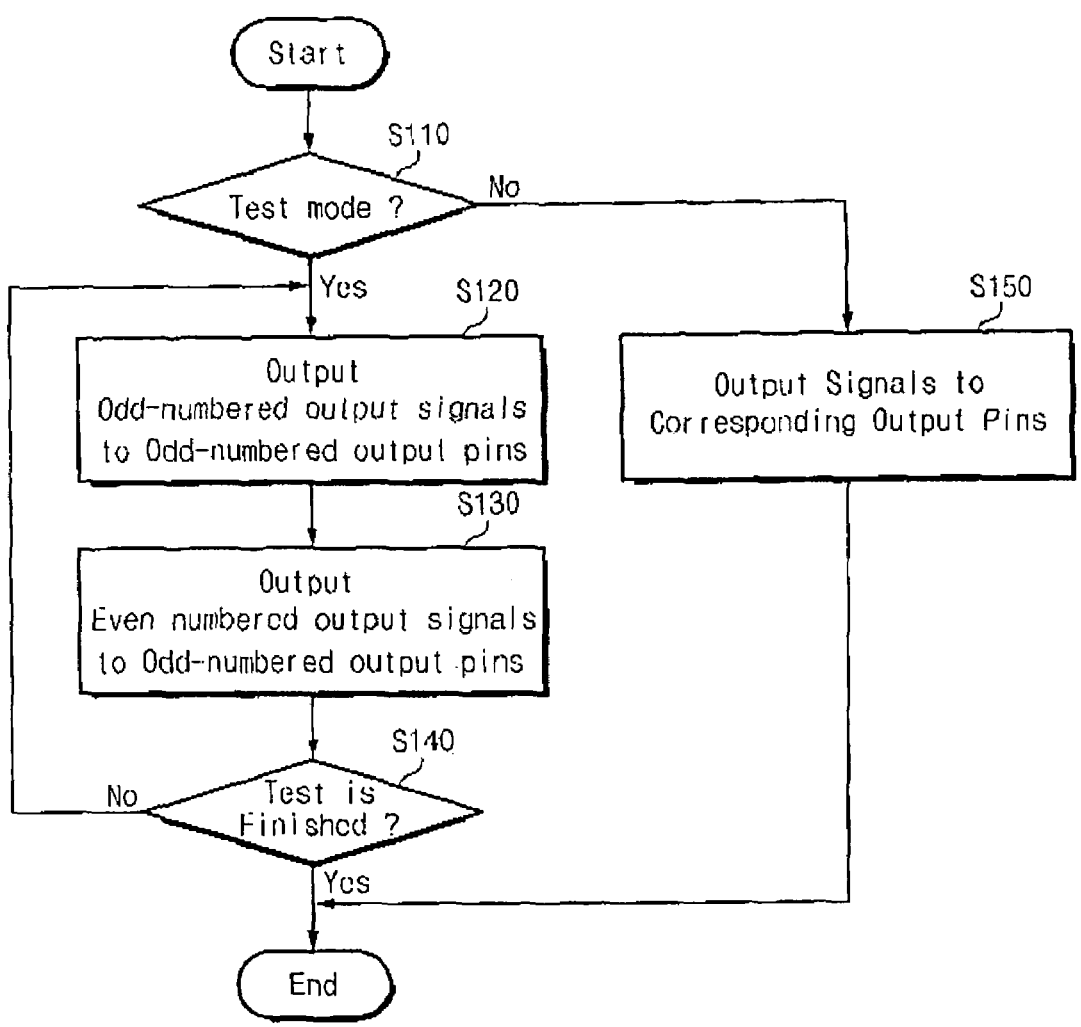
FIG. 3 is a flowchart of controlling multiplexers in the source driver IC shown in FIG. 2.

Referring now to FIG. 3, which illustrates the data output operations in normal and test modes using a flowchart of controlling the multiplexers 70_1~70_n/2 in the source driver IC 100 of FIG. 2. Multiplexers 70_1~70_n/2 operate in response to a test mode signal TM. The test mode signal TM has a low level (i.e., logic "0") in a normal mode and has a high level (i.e., logic "1") in a test mode.

At box S110, the multiplexers 70_1~70_n/2 determine whether the test mode signal TM indicates a test mode. If the test mode signal TM indicates the normal mode, i.e., low level, this routine proceeds to box S150.

At box S150, source driving signals S1~Sn, from the amplifiers 60_1~60_n, are sent to their corresponding output pins P1~Pn, via the multiplexers 70_1~70_n/2. For example, the source driving signal S1, from the amplifier 60_1, is sent to output pin P1 through multiplexer 70_1, and the source driving signal S2, from the amplifier 60_2, is sent to output pin P2 through the multiplexer 70_1.

When the test mode signal TM indicates the test mode by, e.g., being at a high level, this routine proceeds to box S120. At box S120, the first test cycle, a group of source signals (e.g., odd-numbered source signals) S1, S3, . . . , and Sn-1, from a group of amplifiers (e.g., odd-numbered amplifiers) 60_1, 60_3, . . . , and 60_n-1, are sent to a group of output pins (e.g., odd-numbered output pins) P1, P3, . . . , and Pn-1 through the multiplexers 70_1~70_n/2. That is, during the first test cycle, multiplexers 70_1~70_n/2 output the odd-numbered source driving signals S1, S3, . . . , and Sn-1 to the odd-numbered output pins P1, P3, . . . , and Pn-1.

At box S130, the second test cycle, the other group of source signals (e.g., even-numbered source signals) S2, S4, . . . , and Sn, from the other group of amplifiers (e.g., even-numbered amplifiers) 60_2, 60_4 . . . , and 60_n, are sent to the group of the output pins (e.g., odd-numbered output pins) P1, P3, . . . , and Pn-1 through the multiplexers 70_1~70_n/2. That is, during the second test cycle, the multiplexers 70_1~70_n/2 output the even-numbered source driving signals S2, S4, . . . , and Sn to the odd-numbered output pins P1, P3, . . . , and Pn-1.

Test pins T1~Tn/2 of the test device 200 are connected to corresponding pins, among a group of output pins (e.g., odd-numbered pins) P1, P3, . . . , and Pn-1, respectively. During the first test cycle the odd-numbered source driving signals S1, S3, . . . , and Sn-1 of the source driver IC 100 are transferred to the test device 200 through the odd-numbered output pins P1, P3, . . . , and Pn-1 and the test pins T1~Tn/2. During the second test cycle, the even-numbered source driving signals S2, S4, . . . , and Sn of the source driver IC 100 are transferred to the test device 200 through the odd-numbered output pins P1, P3, . . . , and Pn-1 and the test pins T1-Tn/2.

At box S140, it is determined whether the test mode is completed. When the test mode signal TM transitions to a low level, the multiplexers 70_1~70_n/2 determines the test mode is completed. When the test mode signal TM is maintained at a high level, the multiplexers returns to box S120. According to the present invention, the test device 200 having n/2 input pins is used to test a semiconductor integrated circuit having n output pins.

Figure 4B:
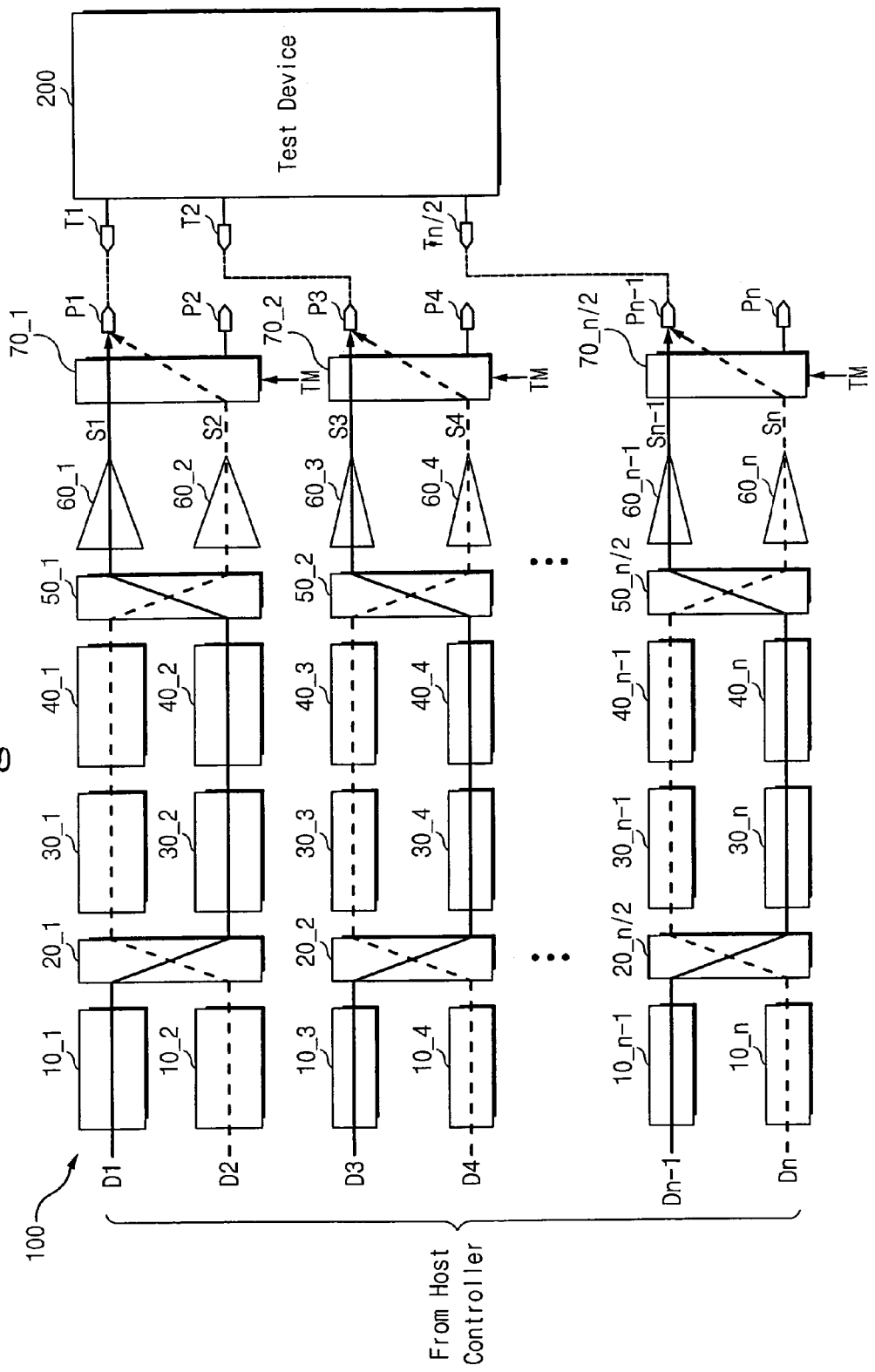

Referring now to FIG. 4A and FIG. 4B, where the test mode data output paths of the source driver IC 100 are illustrated. The data output path of FIG. 4A is a test mode path where a group of odd data signals D1, D3, . . . , and Dn-1, provided from a host controller, are respectively decoded by N-decoders 40_1, 40_3, . . . , and 40_n-1 and the other group of even data signals D2, D4, . . . , and Dn are respectively decoded by P-decoders 40_2, 40_4, . . . , and 40_n. The decoded data signals, which are now referred to as source driving signals S1~Sn, are then sent to output pins P1, P3, . . . , and Pn. The data output path of FIG. 4B is a test mode path where when a group of odd data signals D1, D3, . . . , and Dn-1 provided from a host controller are respectively decoded by P-decoders 40_2, 40_4, . . . , and 40_n and the other group of even data signals D2, D4, . . . , and Dn are respectively decoded by N-decoders 40_1, 40_3, . . . , and 40_n-1. The decoded data signals, which are now referred to as source driving signals S1~Sn, are then sent to output pins P1, P3, . . . , and Pn. In FIG. 4A and FIG. 4B, a solid line denotes a data path during a first test cycle and a dotted line denotes a data path during a second test cycle.

Figure 5:
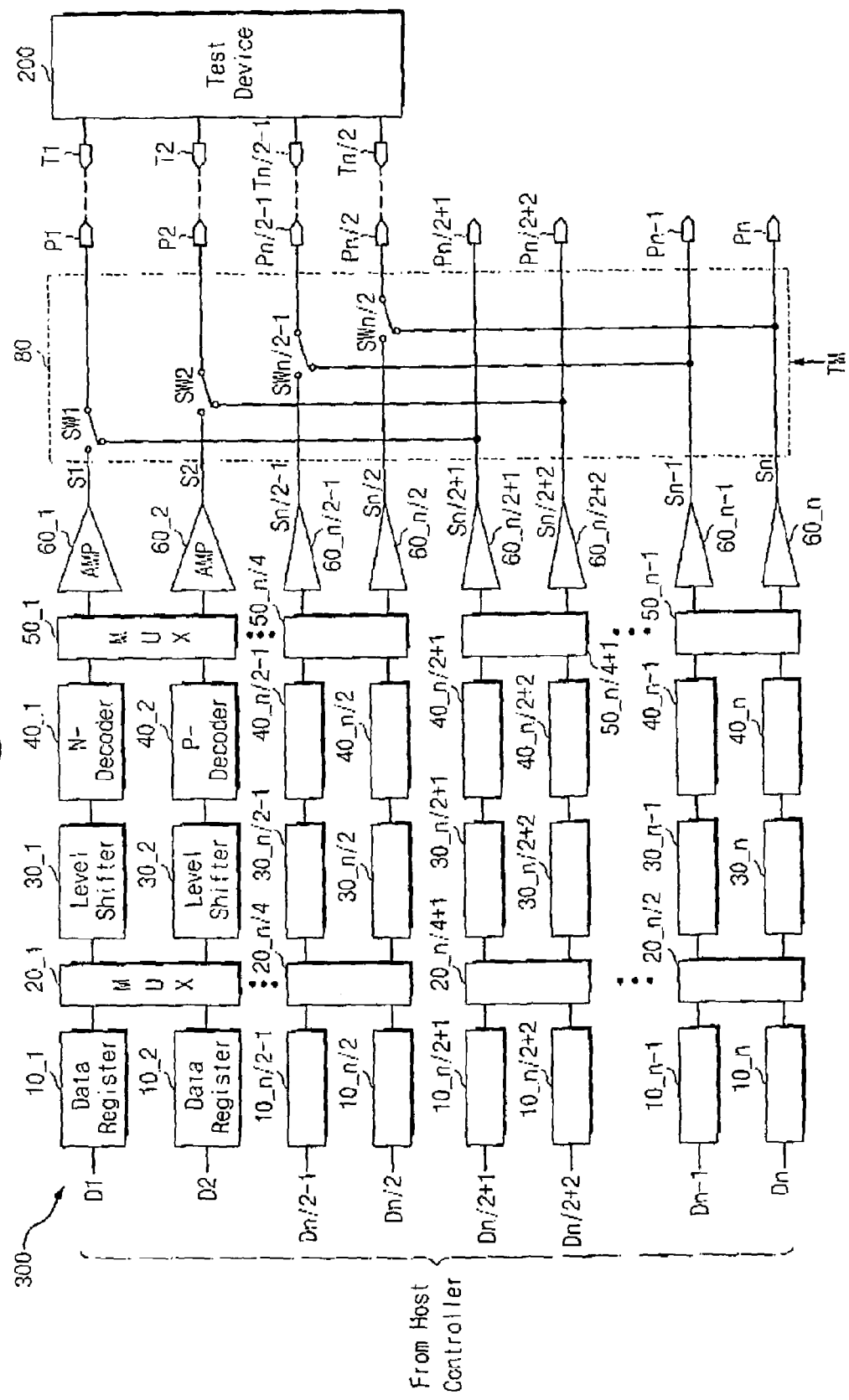
FIG. 5 is a block diagram of a source driver IC according to another embodiment of the present invention.

Referring now to FIG. 5, a source driver IC according to another embodiment of the present invention is shown. Unlike the source driver IC 100 of FIG. 2, the source driver IC 300 of FIG. 5 includes a switching circuit 80 instead of multiplexers 70_1~70_n-1. In FIG. 5 and FIG. 2, the same numerals denote the same components.

The switching circuit 80 includes n/2 switches SW1~SWn/2 that operate in response to a test mode signal TM. As described above, the test mode signal TM has a low level in a normal mode and has a high level in a test mode. The stationary side of the switches SW1~SWn/2 is connected to output pins P1~Pn/2, respectively. The alternating side of the switches SW1~SWn/2 is either connected to output terminals of a group of amplifiers 60_1~60_n/2 or the output terminals of the other group of amplifiers 60_n/2+1~60_n, depending upon the mode of operation. In a normal mode, the alternating side of the switches SW1~SWn/2 is connected to output terminals of a group of amplifiers 60_1~60_n/2. In a test mode, the alternating side of the switches SW1-SWn/2 is connected to the output terminals of the group of the amplifiers 60_1~60_n/2 during a fist test cycle and are connected to output terminals of the other group of the amplifiers 60_n/2+1~60_n during a second test cycle.

Figure 6:
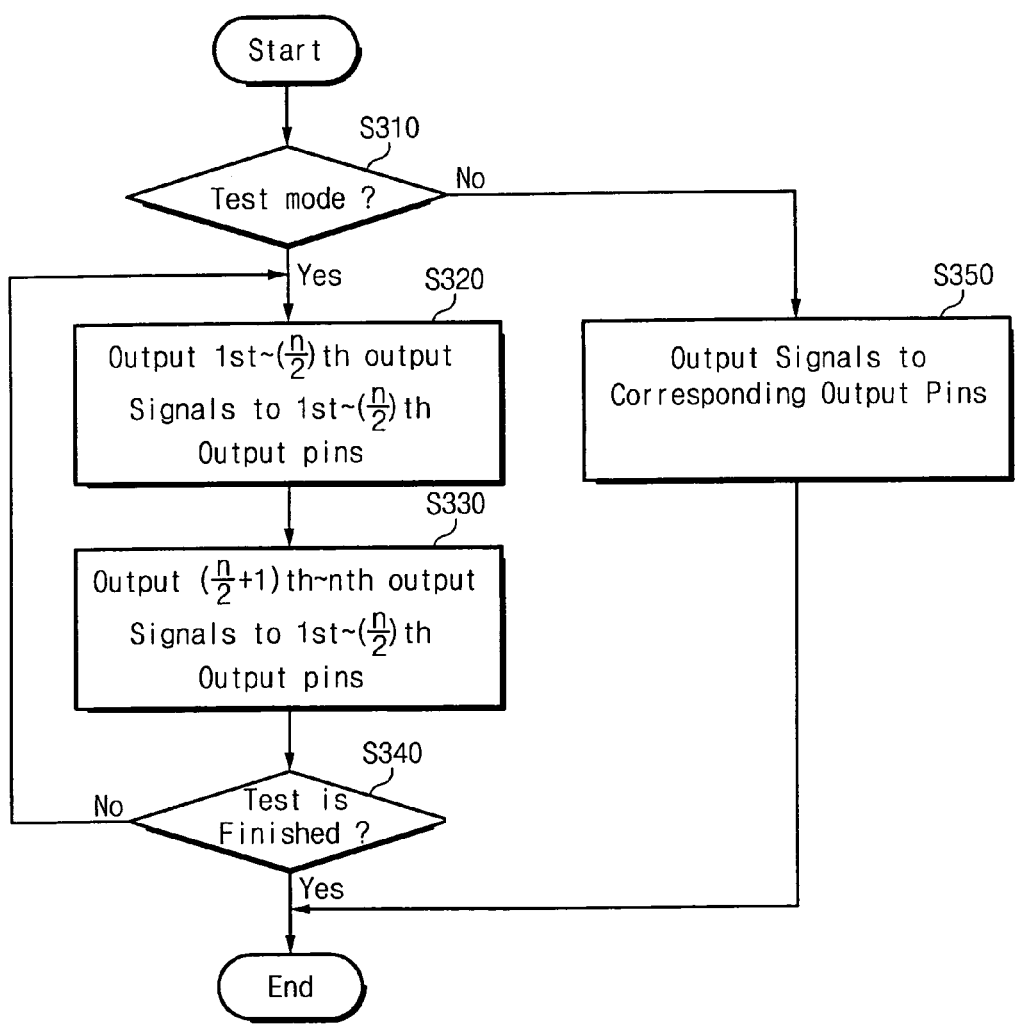
FIG. 6 is a flowchart of controlling a switching circuit according to another embodiment of the present invention.

FIG. 6 is a flowchart of controlling the switching circuit 80 of FIG. 5. Referring to FIG. 6, at box S310, the switching circuit 80 determines whether the test mode signal TM indicates a test mode. If the test mode signal TM indicates a normal mode, this routine proceeds to box S350 where the alternating side of the switches SW1~SWn/2 is connected to output terminals of a group of amplifiers 60_1~60_n/2. Thus, a group of source driver signals S1~Sn/2, from the group of the amplifiers 60_1~60_n/2, are sent to the output pins P1~Pn/2 through the switches SW1~SWn/2. The other group of source driving signals Sn/2+1~Sn, from the other group of amplifiers 60_n/2+1~60_n, are sent to output pins Pn/2+1~Pn.

If the test mode signal TM indicates a test mode, this routine proceeds to box S320 in which a first test cycle starts. During the first test cycle, the alternating side of the switches SW1~SWn/2 is connected to the output terminals of the group of the amplifiers 60_1~60_n/2. Thus, a group of source driving signals S1~Sn/2, from the group of the amplifiers 60_1~60_n/2, are sent to the output pins P1~Pn/2 through the switches SW1~SWn/2.

At box S330, a second test cycle starts. During the second test cycle, the alternating side of the switches SW1~SWn/2 is connected to the output terminals of the other group of the amplifiers 60_n/2+1~60_n. Thus, the other group of the source driving signals Sn/2+1~Sn, from the other group of the amplifiers 60_n2+1~60n, are sent to the output pins P1~Pn/2.

The test pins T1~Tn/2 of the test device 200 are connected to the group of the output pins P1~Pn/2, respectively. Thus, during the first test cycle, the group of the source driving signals S1~Sn/2 of the source driver IC 300 are transferred to the test device 200 through the group of the output pins P1~Pn/2 and the test pins T1~Tn/2. During the second test cycle, the other group of the source driving signal Sn/2+1~Sn of the source driver IC 300 are transferred to the test device 200 through the group of the output pins P1~Pn/2.

At box S340, the switching circuit 80 determines that the test mode is completed when the test mode signal TM transitions to a low level. When the test mode signal TM is maintained at a high level, the routine returns to box S320. According to the present invention, the test device 200 having n/2 input pins is used to test a semiconductor integrated circuit having n output pins.

Figure 7A:
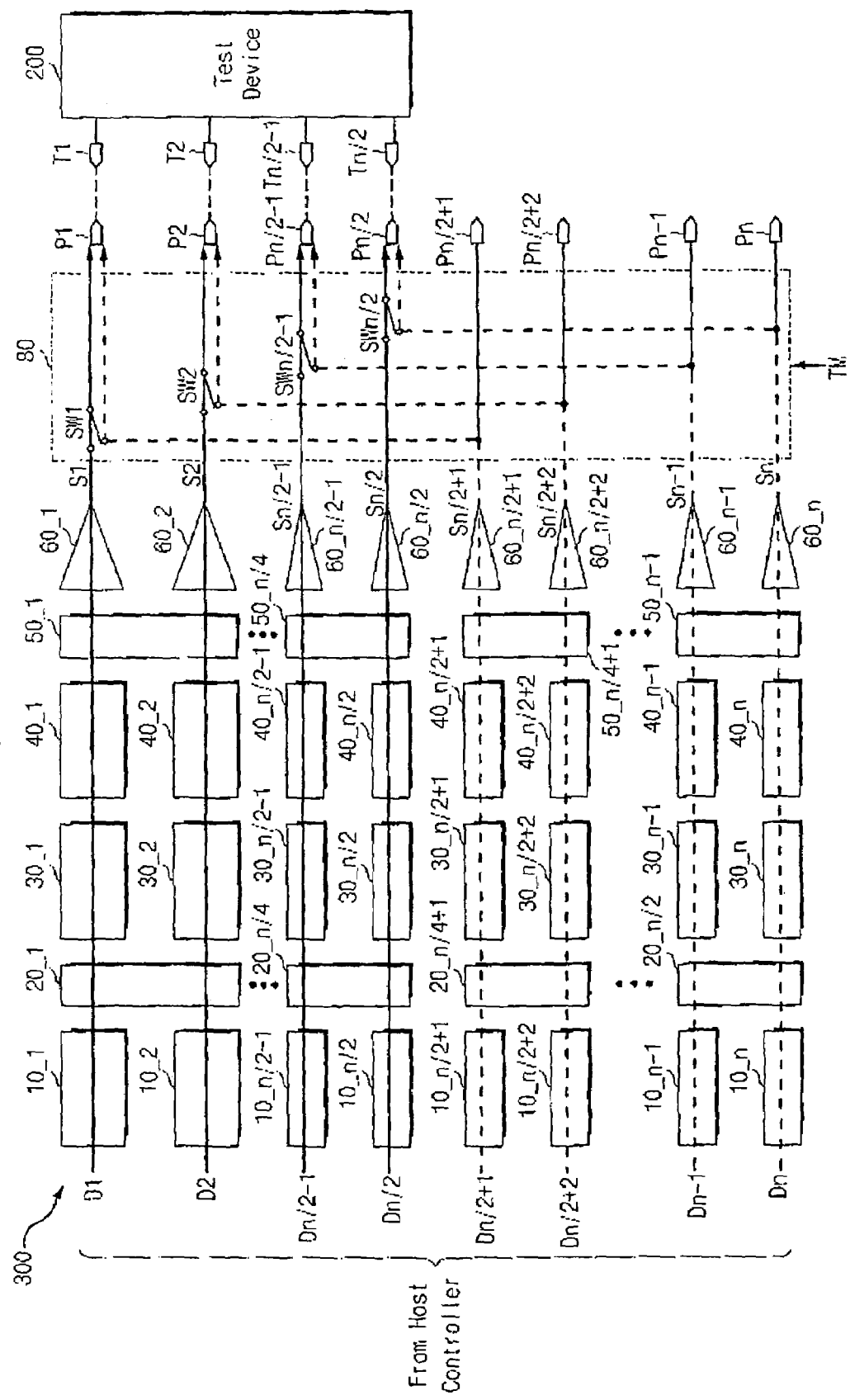
FIG. 7A and FIG. 7B show data output paths for an IC 100 shown in FIG. 5.
Figure 7B:
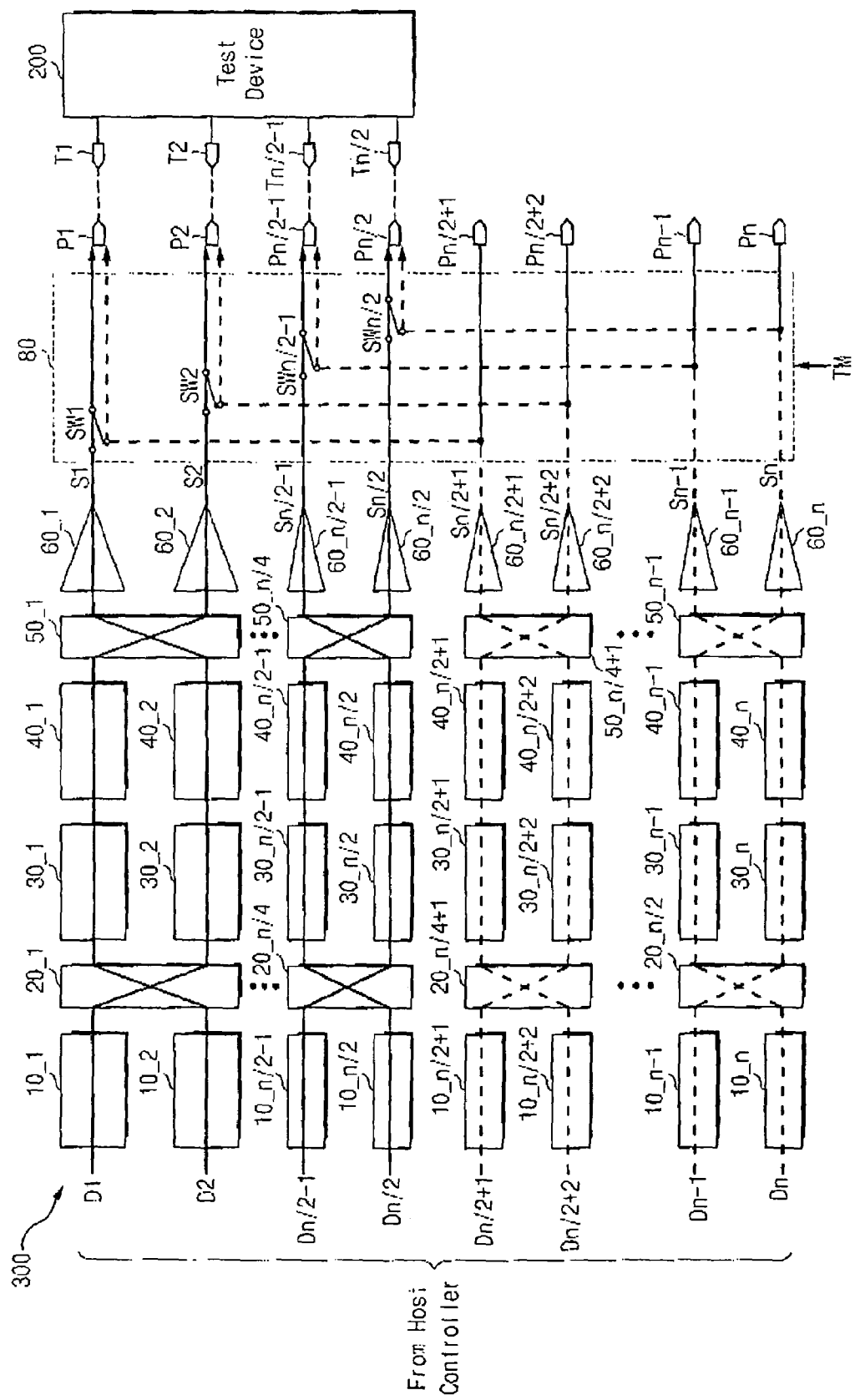

FIG. 7A and FIG. 7B illustrate the test mode data output paths. The data output path of FIG. 7A is a data output path where the odd-numbered data signals D1, D3, . . . , and Dn-1, provided from a host controller, are decoded by N-decoders 40_1, 40_3, . . . , and 40_n-1 and even-numbered data signals D2, D4, . . . , and Dn are decoded by P-decoders 402, 40_4, . . . , and 40_n, respectively. During the first test cycle, the decoded data signals provided from the N-decoders 40_1, 40_3, . . . , and 40_n/2-1 and P-decoders 40_2, 40_4, . . . , and 40_n/2 are sent to output pins P1~Pn/2. During the second cycle, the decoded data signals provided from the odd N-decoders 40_n/2+1~40_n-1 and even P-decoders 40_n/2+240_n/2 are sent to output pins P1~Pn/2. The data output path of FIG. 7B is a data output path where when odd-numbered data signals D1, D3, . . . , and Dn-1 provided from a host controller are respectively decoded by P-decoders and even-numbered data signals D2, D4, . . . , and Dn are respectively decoded by N-decoders, data signals provided from a host decoder are sent to output pins P1~Pn/2, in two cycles as illustrated above. In FIG. 7A and FIG. 7B, a solid line denotes a data path during a first test cycle and a dotted line denotes a data path during a second test period.

As we explain above, a test device having n/2 test pins is used to test a semiconductor integrated circuit having n output pins. The invention, however, is not limited to only having two distinct test cycles, which send n/2 output signals from half of the output pins to the n/2 test pins each cycle. Numerous test cycles may be implemented, where, for each test cycle (T), the minimum number of test pins required in a test device is equal to n/T. Therefore, as the number of test cycles increases the number of test pins needed decreases. It is, therefore, possible to easily fabricate the test device and at a low cost. A test device having the same number of input pins as a semiconductor integrated circuit can test two semiconductor integrated circuits at the same time.

Other modifications and variations to the invention will be apparent to a person skilled in the art from the foregoing disclosure. Thus, while only certain embodiment of the invention has been specifically described herein, it will be apparent that numerous modifications may be made thereto without departing from the spirit and scope of the invention.

We claim:

1. A semiconductor integrated circuit comprising:
    a plurality of data output pins divided in at least two groups of data output pins;
    a data processing circuit to generate output signals responsive to an input signal; and
    an output selection circuit with at least a normal mode and a test mode;
    where a first group of output signals are provided to a first group of data output pins during a first test cycle of the test mode;
    where a second group of output signals are provided to the first group of data output pins during a second test cycle of the test mode; and
    where during the normal mode:
        the first group of output signals are provided to the corresponding data output pins of the first group of data output pins; and
        the second group of output signals are provided to the corresponding data output pins of a second group of data output pins.

2. The semiconductor integrated circuit of claim 1 where the output selection circuit repeats the first and second test cycles during testing.

3. The semiconductor integrated circuit of claim 1 where the output selection circuit sends odd output signals to odd data output pins during the first cycle of the test mode; and
    where the output selection circuit sends even output signals to odd data output pins during the second test cycle of the test mode.

4. The semiconductor integrated circuit of claim 1 where the output selection circuit sends odd output signals to even data output pins during the first cycle of the test mode; and
    where the output selection circuit sends even output signals to even data output pins during the second test cycle of the test mode.

5. The semiconductor integrated circuit of claim 1 where the output selection circuit is adapted to send all output signals to corresponding output pins during the normal mode.

6. The semiconductor integrated circuit of claim 1,
    where the plurality of data output pins arc divided in at least two groups of data output pins, including the first group of data output pins; and
    where the first group and the second group of output signals are not provided to a second group of data output pins during the first test cycle and the second test cycle of the test mode.

7. A method for outputting data during a test mode of a semiconductor integrated circuit having a plurality of data output pins divided in at least two groups of data output pins, the method comprising:
    sending some output signals to a first group of the data output pins during a first phase of the test mode;
    sending remaining output signals to the first group of the data output pins during a second phase of the test mode;
    sending the some output signals to the corresponding data output pins of the first group of the data output pins during a normal mode; and
    sending the remaining output signals to the corresponding data output pins of a second group of the data output pins during the normal mode.

8. The method of claim 7 where the sending some output signals and the sending remaining output signals are repeated during the test mode.

9. The method of claim 7 where sending some output signals includes sending an ith output signal (i being a positive integer) to an ith data output pin.

10. The method of claim 7, where the plurality of data output pins are divided in at least two groups of data output pins including the first group of data output pins, the method conspiring:
    not sending the some output signals and the remaining output signals to a second group of data output pins during the first phase and the second phase of the test mode.

11. The method of claim 9 where i is a positive odd integer.

12. The method of claim 9 where sending remaining output signals includes sending an (i+1)th output signal (i being a positive integer) to an ith data output pin.

13. The method of claim 9 where i is a positive even integer.

* * * * *

UNITED STATES PATENT AND TRADEMARK OFFICE
CERTIFICATE OF CORRECTION

PATENT NO. : 7,321,998 B2  Page 1 of 1
APPLICATION NO. : 10/803792
DATED : January 22, 2008
INVENTOR(S) : Nam-Jung Her et al.

It is certified that error appears in the above-identified patent and that said Letters Patent is hereby corrected as shown below:

Column 2, line 41, the word "arc" should read -- are --;
Column 4, line 55, the words "60_4...," should read -- 60_4, ..., --;
Column 6, line 44, the word "402," should read -- 40_2, --;
Column 6, line 50, the word "40_n/2+240_n/2" should read -- 40_n/2+2~40_n/2 --;
Column 8, line 6 claim 6, the word "arc" should read -- are --;
Column 8, line 36 claim 10, the word "conspiring" should read -- comprising --.

Signed and Sealed this

Seventh Day of October, 2008

JON W. DUDAS
*Director of the United States Patent and Trademark Office*